(12) United States Patent
Lu et al.

(10) Patent No.: US 9,668,391 B2
(45) Date of Patent: May 30, 2017

(54) ELECTROMAGNETIC SHIELDING OPTICAL WINDOW BASED ON ARRAY OF RINGS AND SUB-RINGS HAVING TRIANGULAR AND ORTHOGONAL MIXED DISTRIBUTION

(71) Applicant: HARBIN INSTITUTE OF TECHNOLOGY, Heilongjiang (CN)

(72) Inventors: Zhengang Lu, Heilongjiang (CN); Jiubin Tan, Heilongjiang (CN)

(73) Assignee: HARBIN INSTITUTE OF TECHNOLOGY, Heilongjiang (CN)

( * ) Notice: Subject to any disclaimer, the term of this patent is extended or adjusted under 35 U.S.C. 154(b) by 0 days.

(21) Appl. No.: 15/118,815

(22) PCT Filed: Dec. 16, 2014

(86) PCT No.: PCT/CN2014/093897
§ 371 (c)(1),
(2) Date: Aug. 12, 2016

(87) PCT Pub. No.: WO2015/120738
PCT Pub. Date: Aug. 20, 2015

(65) Prior Publication Data
US 2017/0055380 A1 Feb. 23, 2017

(30) Foreign Application Priority Data
Feb. 14, 2014 (CN) .......................... 2014 1 0051544

(51) Int. Cl.
*H05K 9/00* (2006.01)
*G02B 5/18* (2006.01)
(52) U.S. Cl.
CPC ......... *H05K 9/0094* (2013.01); *H05K 9/0086* (2013.01); *G02B 5/18* (2013.01); *G02B 2207/121* (2013.01)

(58) Field of Classification Search
CPC ............... H05K 9/0086; H05K 9/0094; G02B 2207/121
See application file for complete search history.

(56) References Cited

U.S. PATENT DOCUMENTS 4,772,760 A * 9/1988 Graham ................ B64C 1/1476
174/389
4,871,220 A  10/1989 Kohin
(Continued)

FOREIGN PATENT DOCUMENTS

CN  2203342 Y  7/1995
CN  2233113 Y  8/1996
(Continued)

OTHER PUBLICATIONS

International Preliminary Report on Patentability for Chinese Application No. PCT/CN2014/093897 dated Aug. 16, 2016.
(Continued)

*Primary Examiner* — Hung V Ngo
(74) *Attorney, Agent, or Firm* — Jenkins, Wilson, Taylor & Hunt, P.A.

(57) ABSTRACT

An optical window based on an array of rings and sub-rings having a triangular and orthogonal mixed distribution is suited for electromagnetic shielding. The array has metal rings of the same diameter acting as basic rings closely arranged according to an equilateral triangular and two-dimensional orthogonal square mixed arrangement and is loaded on an optical window transparent substrate surface. Adjacent basic rings are connected externally tangentially. Metal sub-rings are arranged within each basic ring and connected thereto internally tangentially. Each basic ring and its sub-rings constitute a basic unit. At tangential connection locations of the rings, wires overlap or metal is provided to ensure reliable electrical connections between connected rings, thus all rings are conductive. The metal grid
(Continued)

structure significantly reduces non-uniformity of grid high-order diffracted light intensity distribution, thereby causing stray light distribution caused by diffraction to be more uniform and imaging to be less affected.

10 Claims, 7 Drawing Sheets

(56) References Cited

U.S. PATENT DOCUMENTS

| | | | | |
|---|---|---|---|---|
| 5,017,419 | A * | 5/1991 | Smith | G03F 7/0007 174/390 |
| 8,261,432 | B2 | 9/2012 | Bunlusin et al. | |
| 9,320,136 | B2 * | 4/2016 | Frey | H05K 1/0274 |
| 2003/0013048 | A1 * | 1/2003 | Gilson | H05K 9/0096 430/321 |
| 2009/0027300 | A1 * | 1/2009 | Kudo | H05K 9/0003 343/912 |
| 2010/0136288 | A1 * | 6/2010 | Tanaka | H01J 11/44 428/141 |
| 2010/0180428 | A1 * | 7/2010 | Jones | H05K 9/0094 29/592.1 |
| 2011/0297436 | A1 * | 12/2011 | Ohashi | B05D 1/00 174/389 |
| 2014/0158417 | A1 * | 6/2014 | Zmek | H05K 9/0094 174/389 |
| 2017/0055381 | A1 | 2/2017 | Tan et al. | |

FOREIGN PATENT DOCUMENTS

| | | |
|---|---|---|
| CN | 1200231 A | 11/1998 |
| CN | 1482853 A | 3/2004 |
| CN | 1522107 A | 8/2004 |
| CN | 1870881 A | 11/2006 |
| CN | 1889822 A | 1/2007 |
| CN | 101222839 A | 7/2008 |
| CN | 101222840 A | 7/2008 |
| CN | 101917837 A | 12/2010 |
| CN | 103826428 A | 5/2014 |
| JP | 2002111278 A | 4/2002 |
| WO | WO 2015/120739 A1 | 8/2015 |

OTHER PUBLICATIONS

International Search Report for WO 2015120738A1 dated Mar. 25, 2015.
Halman, Jennifer I. et al., "Predicted and measured transmission and diffraction by a metallic mesh coating," Window and Dome Technologies and Materials XI, Proc. of SPIE vol. 7302, p. 73020Y, 2009.
Murray, Ian B., et al., "Numerical comparison of grid pattern diffraction effects through measurement and modeling with OptiScan software," Window and Dome Technologies and Materials XII, vol. 8016, p. 8016OU, 2011.
International Search Report for Application No. PCT/CN2014/093898 dated Mar. 9, 2015.
International Preliminary Report on Patentability for Chinese Application No. PCT/CN2014/093898 dated Aug. 16, 2016.
Notice of Allowance for U.S. Appl. No. 15/118,820 dated Mar. 17, 2017.

* cited by examiner (a) (b) (c) (d)

(a) (b) (c)

ELECTROMAGNETIC SHIELDING OPTICAL WINDOW BASED ON ARRAY OF RINGS AND SUB-RINGS HAVING TRIANGULAR AND ORTHOGONAL MIXED DISTRIBUTION

TECHNICAL FIELD

The present invention belongs to the field of electromagnetic shielding of an optical transparent piece, and particularly relates to an electromagnetic shielding optical window based on an array of rings and sub-rings having triangular and orthogonal mixed distribution.

BACKGROUND ART

With the increase of the broadening and strength of the application spectrum of electromagnetic waves, requirements for electromagnetic shielding optical windows in the field of aerospace equipment, advanced optical instrument, communication equipment, medical diagnostic equipment and confidential facilities, etc. are higher and higher. The optical window is mainly requested to have super strong capability of wide-band electromagnetic shielding, high light transmittance, and the less impact on optical imaging, observation and detection the better. For example, in the field of aerospace equipment, optical window of the aircraft must achieve a high-quality electromagnetic signal isolation inside and outside the cabin, which on the one hand can shield external electromagnetic interference and harmful electromagnetic signals to avoid failure of the electronic equipment in the cabin, and on the other hand prevent electromagnetic signals from transmitting out of the optical window and causing electromagnetic leakage during operation of the electronic equipment in the cabin. However, light transmission is an essential function of the optical window, so electromagnetic shielding of the optical window should reduce the impact on the transparency of the optical window as much as possible, in particular the impact on functions of optical detection or optical imaging. Similarly, optical window of advanced optical instrument should have as high light transmittance as possible and as low impact on image quality as possible, so as to achieve high-quality detection and measurement, and to prevent impact of electromagnetic interference on photodetectors inside the instrument; for confidential building facilities for government agencies, military command areas and important scientific research units, the window glass of the houses needs to be guaranteed in lighting and also designed with electromagnetic shielding to prevent secret from divulging due to important information transmitting out of the window in the form of electromagnetic radiation when indoor computers and other electronic equipment are at work; optical window of the medical electromagnetic isolation chamber needs to ensure that the vast majority of the indoor electromagnetic waves is shielded to prevent health damage to the outdoor operator for always suffering electromagnetic radiation, etc. Currently, a transparent conductive film, a metal induced transmission type multi-layer film structure, the band-block frequency selective surface and a metal grid having a millimeter or submillimeter cycle, etc. are mainly used for electromagnetic shielding of this type of optical window.

The transparent conductive film is a transparent metal oxide film comprising indium tin oxide as the main material, and is often used in occasions where the visible light wave band is transparent, but is not suitable for the wide lucent wave-band, because it does not have strong shielding capability though having wide microwave shielding wave-band. Metal-induced transmission type multilayer film structure realizes shielding of the electromagnetic waves by using a composite structure of multilayer metal thin films and dielectric films. It has relatively strong ability of shielding low-frequency microwaves, but its light transmission rate is not high because the transmission regions are mainly visible light and ultraviolet light. Frequency selective surface uses the periodic resonating unit structure to achieve the functions of a band-pass or band-block filter, and because of its high metal coverage, it can effectively reflect the interfering electromagnetic waves beyond the operating band, but the optical transmittance is relatively low, thereby reducing the imaging quality for optical detection and causing difficulty in optical image processing, pattern recognition, target acquisition and tracking. In sum, all the above technical solutions are obviously deficient in meeting the two requirements of the optical window having high light transmittance at wide waveband and high electromagnetic shielding ability at wide frequency band. In contrast, a metal grid having a cycle in millimeter or sub-millimeter can achieve strong electromagnetic shielding at low frequency and wide waveband because its cycle is much shorter than the interfering electromagnetic wavelength. The cycle of the metal grid is much longer than the optical wavelength, and thus can guarantee transmittance of optical waveband. Therefore, the metal grid with a cycle in millimeter or sub-millimeter has good transparent and conductive performances and can meet the requirements of the optical window for high light transmittance and wideband electromagnetic shielding, so it has been widely applied in the technical field of electromagnetic shielding of an optical window.

1. In patent Ser. No. 03/115,313.5 with the title of "An Electromagnetic Shielding Observation Window", a single- or multiple-layer metal mesh and a semiconductor-like quantum well structure are used to form an electromagnetic shielding structure, which can achieve an electromagnetic shielding efficiency of over 50 dB within 10 GHz and a light transmittance of up to 50% or more at the high visible light transmission area.

2. In U.S. Pat. No. 9,324,2068.0 with the title of "Electromagnetic Shielding Glass", an electromagnetic shielding structure is formed by sandwiching a conductive metal mesh between two layers of glass and adhering on the metal frame by using a conductive transparent film at the outer sides of the glass, and such structure has certain lighting property.

3. In U.S. Pat. No. 9,423,1862.5 with the title of "An Electromagnetic Shielding Observation Window Having no Moiré Fringe", two layers of metal meshes which are different in number are placed in parallel, and their warp and weft form an included angle, so as to eliminate the Moiré fringe phenomenon and achieve a clearer view.

4. In patent Ser. No. 02/157,954.7 with the title of "Highly Effective Information Leakage-Preventing Glass", each side of the metal mesh is provided with a layer of polycarbonate film whose outer sides are attached to a glass layer, and heat pressing is performed to form an electromagnetic shielding structure; such structure has high shielding efficiency when the light transmittance comes up to 60%.

5. Patent No. 200610084149.8 with the title of "Electromagnetic Wave Shielding Film and Method for Manufacturing the Same" describes a highly transparent electromagnetic shielding film having a metal mesh pattern formed by the photolithography process, and the main object of the invention is to reduce consumption of the metal and overcome the environmental pollution resulting from the use of a curing adhesive between the metal layer and the film substrate.

6. The U.S. Pat. No. 4,871,220 with the title of "Short wavelength pass filter having a metal mesh on a semiconducting substrate" describes a metal mesh having a square-shaped structure, which is used for achieving the anti-electromagnetic interference performance of the optical window.

7. Patent No. 201010239355.8 with the title of "An Electromagnetic Shielding Conformal Optical Window Having a Weft-Warp Grid Structure" describes an electromagnetic shielding conformal optical window having a weft-warp metal grid structure formed by using the metal grid technology and the conformal optical window technology, and mainly solves the problem of the structure design of the metal grid of the conformal optical window and improves the electromagnetic shielding performance of the conformal optical window.

8. Patent No. 200610010066.4 with the title of "Electromagnetic Shielding Optical Window Having Ring Metal Grid Structure" describes a metal grid unit having a ring-shaped profile, which is used for achieving the electromagnetic shielding function of the optical window; as compared to the single-layer squared metal grid, the light transmittance and shielding capability have been improved, and stray light caused by high order diffraction has also been homogenized in a certain degree.

9. Patent No. 200810063988.0 with the title of "An electromagnetic shielding optical window having a double-layer squared metal grid structure" describes an electromagnetic shielding optical window which is formed by placing squared metal grids or metal meshes having the same structural parameters in parallel on both sides of an optical window or a transparent substrate, and the electromagnetic shielding efficiency is greatly improved without reducing the light transmittance.

10. Patent No. 200810063987.6 with the title of "An electromagnetic shielding optical window having a double-layer ring-shaped metal grid structure" describes an electromagnetic shielding optical window formed by loading two layers of ring metal grids to both sides of the optical window, and solves the problem that the high light transmittance and high electromagnetic shielding efficiency cannot be achieved simultaneously.

11. Jennifer I. Halman etc. from the United States Battelle Institute developed an inductive metal grid having a ring unit-based hub-spoke stripe structure and a multi-ring overlapping structure (Jennifer I. Halman, etc., "Predicted and measured transmission and diffraction by a metallic mesh coating", Proc. SPIE, 2009, 7302: 73020Y-1-73020Y-8), and believed that such structure can achieve homogenization of the grid high-order diffraction distribution and low sidelobe, and is favorable for imaging.

12. Ian B. Murray from the US Exotic Electro-Optics Company, together with Victor Densmore and Vaibhav Bora from University of Arizona, US, etc. reported the impact on the diffraction property after introducing parameters into an inductive metal grid having a hub-spoke stripe structure and a multi-ring overlapping structure and designing with random distribution (Ian B. Murray, Victor Densmore, Vaibhav Bora et al., "Numerical comparison of grid pattern diffraction effects through measurement and modeling with OptiScan software", Proc. SPIE, 2011, 8016: 80160U-1-80160U-15), and pointed out that spacing and diameter of the rings are set as random values within a certain range, which is helpful to improve the uniformity of the high-order diffraction distribution.

With the metal grid (or metal mesh) as the core device for shielding, the above solutions can achieve good electromagnetic shielding effect and certain light transmittance. However, when metal grid (or metal mesh) is used as the electromagnetic shielding structure, the impact of the optical waveband diffraction by the grid is inevitable. Since the cycle of the metal grid is in the magnitude of millimeter or sub-millimeter, in order to achieve high light transmittance, its metal line width is generally in the magnitude of micron or submicron; such configuration parameter has very intense diffraction effect in the optical waveband. Most of the energy of the incident light can be transmitted through the metal grid, and the transmitted portion comprises a zero-order diffracted light and high-order diffracted light. Generally, zero-order diffracted light is useful information for imaging and observation, and the high-order diffracted light constitutes stray light which interferes imaging and detection. Therefore, the proportion of the zero-order diffracted light should be increased as much as possible, and the high-order diffracted light should be allowed to be uniformly distributed if its occurrence cannot be avoided, so that the stray light thus formed becomes comparatively uniform background or noise.

Currently, the metal grids are mainly in the traditional squared grid structure, as the structure mainly adopted in Patent 1-6 (the structure in Patent 7 is a grid-like structure, for it is processed on a curved surface). Squared grid structure is inherently contradictory between light transmission and shielding capability, and cannot have both high light transmittance and high electromagnetic shielding efficiency. In particular, the high-order diffraction energy of the squared grid is mainly concentrated on two axes perpendicular to each other, causing certain impact on the imaging quality or even difficulty in application in occasions having high requirements for imaging quality. A change in the diffraction property of the grid usually requires a change in its structure feature. The above-mentioned patent 200610010066.4 with the title of "an electromagnetic shielding optical window having a ring metal grid structure" proposed to construct a ring metal grid by using metal rings, which overcome the defect of the concentrated distribution of the high-order diffraction energy of the squared metal grid and may ease the contradiction between its light transmission ability and shielding capability. In the above documents 11 and 12, Jennifer I. Halman et al. and Ian B. Murray et al. also proposed a ring unit-based metal grid structure for improving the uniformity of the high-order diffraction distribution. However, studies of Jennifer I. Halman etc. relate to a single cycle ring arrangement structure, and the direction of arrangement is determined, and its effect on regulating the high-order diffraction is comparative to that of the structure proposed in Patent No. 200610010066.4. Although Ian B. Murray et al. made further research and proposed a randomly overlapping ring structure, in which the diameter and spacing of the rings are set as values based on random distribution in a certain range and which achieves further improvement on the uniformity of the high-order diffraction distribution, such random distribution of the diameters and spaces of the rings changes the uniformity of the mesh distribution, causing damage to the electromagnetic shielding efficiency.

With the increasingly complex electromagnetic environment, electromagnetic shielding optical windows are required to have increasingly high light transmittance and electromagnetic shielding capacity. Particularly in the fields of aerospace equipment and advanced optical instruments, optical windows has been required to have not only a light transmittance of 95% or higher, but also an extremely low impact on the imaging quality, and achieve a shielding efficiency of 30 dB or more in a microwave frequency range of less than 20 GHz, which is difficult to be realized by the existing technology. Both Patent 200810063988.0 and Patent 200810063987.6 utilizes a double-layer metal grid placed in parallel on both sides of the transparent substrate of the optical window, and the two layers of metal grids have the same unit shape and structure parameters. By optimizing the distance between two layers of grids, the electromagnetic shielding efficiency can be significantly improved without lowering the light transmittance. However, distribution of the high-order diffraction stray light of this double-layer grid structure is comparative to that of the single-layer grid structure having the same light transmittance, and cannot fully meet the requirements for low impact on the image quality in the fields of future aerospace equipment and advanced optical instruments.

SUMMARY OF INVENTION

An object of the present invention is to develop an electromagnetic shielding optical window based on an array of rings and subrings having a triangular and orthogonal mixed distribution, which can overcome the shortcomings of the above technical solutions of conventional electromagnetic shielding optical window, particularly the problem of relative concentrated stray light distribution caused by the high-order diffraction existing in the single-layer squared metal grid, single-layer ring grid, double-layer squared and ring grids, and achieve the purposes of deep homogenization of high-order diffraction and low impact on the imaging quality.

The present invention adopts the following technical solution: an electromagnetic shielding optical window based on an array of rings and sub-rings having a triangular and orthogonal mixed distribution, characterized in that: the metal grid in the electromagnetic shielding optical window is formed by metal rings having the same diameter as basic rings closely-joining arranged according to an equilateral triangle and two-dimensional orthogonal mixed arrangement and is loaded on the surface of the optical window transparent substrate; adjacent basic rings are connected in an externally tangential manner; connection lines among circle centers of adjacent basic rings constitute an equilateral triangle or a square; adjacent equilateral triangles, adjacent squares, or an equilateral triangle and its adjacent square share an edge or a vertex therebetween; metal sub-rings are provided in each basic ring and are connected with the basic ring in an internally tangential manner; the basic ring and the sub-rings which are connected with the basic ring in an internally tangential manner together constitute a basic unit of a two-dimensional metal grid structure; the basic rings and the sub-rings thereof have diameters in magnitudes of millimeter and sub-millimeter, and have metal line widths in magnitudes of micron and submicron; the connection in an externally tangential manner includes the following cases: ① two rings are externally tangent and a connection metal for connecting two rings is provided at the external tangent point; ② lines of two rings are in seamless overlapping structure at the junction; and ③ lines of the two rings are in seamless overlapping structure at the junction, meanwhile a connection metal for connecting two rings is provided at the overlap; connection in an internally tangential manner includes the following cases: ① two rings are internally tangent and a connection metal for connecting two rings is provided at the internal tangent point; ② lines of two rings are in seamless overlapping structure at the junction, and ③ lines of two rings are in seamless overlapping structure at the junction, meanwhile a connection metal for connecting two rings is provided at the overlap.

As a preferred basic structure, in the electromagnetic shielding optical window based on an array of rings and sub-rings having a triangular and orthogonal mixed distribution, connection lines among circle centers of adjacent basic rings constitute an equilateral triangle or a square, wherein any one square at least shares an edge or a vertex with one equilateral triangle, and any one equilateral triangle at least shares an edge or a vertex with one square.

In the electromagnetic shielding optical window based on an array of rings and sub-rings having a triangular and orthogonal mixed distribution, the sub-rings in each basic unit are in a number of 2 or more and have the same or different diameters, and an included angle formed by connection lines between the circle centers of adjacent sub-rings and the circle center of the basic ring is at any degree, and sub-rings in different basic units are equal-diameter rings or unequal-diameter rings and are the same or different in number.

In the electromagnetic shielding optical window based on an array of rings and sub-rings having a triangular and orthogonal mixed distribution, adjacent sub-rings in the basic unit are connected in an externally tangential manner or are intersected with each other.

As a preferred structure, in the electromagnetic shielding optical window based on an array of rings and sub-rings having a triangular and orthogonal mixed distribution, the diameters of the sub-rings in each basic unit are the same, and the included angles formed by the connection lines between the circle centers of adjacent sub-rings and the circle center of the basic ring are equal.

As a preferred structure, in the electromagnetic shielding optical window based on an array of rings and sub-rings having a triangular and orthogonal mixed distribution, the sub-rings in different basic units are the same in number and equal in diameter.

As a preferred structure, in the electromagnetic shielding optical window based on an array of rings and sub-rings having a triangular and orthogonal mixed distribution, the sub-rings in different basic units are in the same relative position, and are closely-joining arranged by one basic unit upon duplication according to an equilateral triangular and two-dimensional orthogonal mixed arrangement.

As a preferred structure, in the electromagnetic shielding optical window based on an array of rings and sub-rings having a triangular and orthogonal mixed distribution, the sub-rings in adjacent basic units have different relative positions, and are closely-joining arranged by one basis unit upon duplication in a two-dimensional metal grid according to an equilateral triangular and two-dimensional orthogonal mixed arrangement, wherein any basic unit rotates around the center of its basic ring by a certain angle with respect to its adjacent basic unit in a two-dimensional plane.

In the electromagnetic shielding optical window based on an array of rings and sub-rings having a triangular and orthogonal mixed distribution, the basic rings, the sub-rings and the connection metal are made of an alloy having good conductivity, and the alloy has a thickness of greater than 100 nm.

In the electromagnetic shielding optical window based on an array of rings and sub-rings having a triangular and orthogonal mixed distribution, an adhesive layer is made of chromium or titanium material.

The inventive step and the excellent effects of the present invention are as follows:

The inventive step of the present invention lies in that: the metal grid in the electromagnetic shielding optical window is formed by metal rings having the same diameter as basic rings closely-joining arranged according to an equilateral triangular and two-dimensional orthogonal mixed arrangement and is loaded on the surface of the optical window transparent substrate; adjacent basic rings are connected in an externally tangential manner; connection lines between circle centers of adjacent basic rings constitute an equilateral triangle or a square; adjacent equilateral triangles, adjacent squares, or an equilateral triangle and its adjacent square share an edge or a vertex; metal sub-rings are provided within each basic ring and are connected with the basic ring in an internally tangential manner; the basic ring and the sub-rings which are connected to it in an internal tangential manner together constitute a basic unit of a two-dimensional metal grid structure; the basic rings and the sub-rings thereof have diameters in magnitudes of millimeter and sub-millimeter, and metal line widths in magnitudes of micron and submicron; the connection in an extremely tangential manner includes the following cases: ① two rings are externally tangent and a connection metal for connecting two rings is provided at the external tangent point; ② lines at the junction of two rings are in seamless overlapping structure; and ③ lines at the junction of the two rings are in seamless overlapping structure, meanwhile a connection metal for connecting two rings is provided at the overlap; connection in an internally tangential manner includes the following cases: ① two rings are internally tangent and a connection metal for connecting two rings is provided at the internal tangent point; ② lines at the junction of two rings are in seamless overlapping structure, and ③ lines at the junction of two rings are in seamless overlapping structure, meanwhile a connection metal for connecting two rings is provided at the overlap. The advantageous effect achieved by the inventiveness of the present invention mainly lies in homogenizing the energy distribution of the high-order diffraction of the metal grid, which is specifically as follows:

The basic rings in the metal grid are arranged in an equilateral triangular arrangement or in a two-dimensional orthogonal arrangement as the basic arrangement manners, and both manners can overcome the defect of concentrated energy distribution of the high-order diffraction in the traditional squared metal grid, thus having the characteristics of effectively homogenizing the energy distribution of high-order diffraction. Besides, forming an array of metal rings by using basic rings closely-joining arranged according to an equilateral triangular and two-dimensional orthogonal mixed arrangement can efficiently adjust the energy distribution of the high-order diffraction of the metal grid array structure, and achieve the purpose of homogenizing the energy distribution of the high-order diffraction. This is the first reason why the metal grid of the present invention can homogenize the energy distribution of high-order diffraction.

Sub-rings are added in the basic ring to form a basic unit, because the subrings in each basic unit are different in number, diameter and position relation, resulting in a loose structure and stray arrangement. Thus, the high-order diffraction has low energy and is uniformly distributed, avoiding the situation where the high-order diffraction energy is in concentrated distribution as in the traditional squared metal grid. Meanwhile, when the light transmittance is guaranteed, it is necessary to increase the diameter of the basic rings, thereby reducing the high-order diffraction energy of each array overall. Further, since there is little chance that the high-order diffraction generated by the sub-ring array structure overlaps with the high-order diffraction of the basic ring array structure, and the high-order diffractions with high energy are not superposed particularly after further parameter optimization, energy distribution of the high-order diffraction is homogenized. This is the second reason why the metal grid of the present invention can homogenize energy distribution of the high-order diffraction.

Each basic unit can rotate by a certain angle with the circle center of its corresponding basic ring as the center, which does not change the aperture ratio of the metal grid and thus does not affect the light transmittance. Yet, it is possible to further modulate the energy distribution of the high-order diffraction, thereby further homogenizing the energy distribution of high-order diffraction. This is the third reason why the metal grid of the present invention can homogenize the energy distribution of high-order diffraction.

In summary, the metal grid structure of the present invention can achieve the thorough homogenization of the energy distribution of high-order diffraction of the grid, which is the most outstanding effect of the present invention. In addition, both the metal ring structure in which the basic rings are closely-joining arranged, and the sub-ring structure function together and thus effectively improve the uniformity of the metal ring grid structure. Further, when the basic unit rotates by a certain angle with the circle center of its corresponding basic ring as the center, it can effectively modulate the energy distribution of the high-order diffraction meanwhile the electromagnetic shielding effect is substantially not affected, and is even improved in some preferred embodiments.

Figure 1:
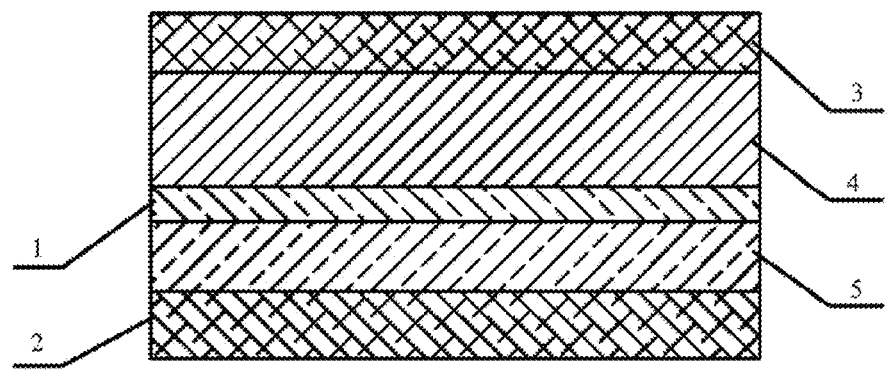
FIG. 1 is a schematic sectional view of a preferred structure of the electromagnetic shielding optical window based on an array of rings and sub-rings having a triangular and two-dimensional orthogonal mixed distribution.

Description of part numbers in the drawings: 1. An adhesive layer; 2. A protective layer; 3. Antireflection film; 4. Transparent substrate; 5. Metal grid; 6. Basic rings; 7. Sub-rings; 8. Connection metal

SPECIFIC EMBODIMENTS

The present invention is further described referring to the figures and preferred embodiments.

The present invention relates to an electromagnetic shielding optical window based on an array of rings and sub-rings having a triangular and orthogonal mixed distribution. In the electromagnetic shielding optical window, a metal grid 5 is made of metal rings having the same diameter acting as basic rings 6 closely-joining arranged according to an equilateral triangular and two-dimensional orthogonal mixed arrangement and is loaded on the surface of an optical window transparent substrate; adjacent basic rings 6 are connected in an externally tangential manner, and connection lines between circle centers of adjacent basic rings 6 constitute an equilateral triangle or a square; adjacent equilateral triangles, adjacent squares, or an equilateral triangle and its adjacent square share an edge or a vertex therebetween; metal sub-rings 7 are provided in each of the basic rings 6 and are connected with the corresponding basic ring in an internally tangential manner; the basic ring 6 and the sub-rings 7 which are connected to it in an internally tangential manner together constitute a basic unit of a two-dimensional metal grid structure; both the basic rings 6 and the sub-rings 7 thereof have diameters in magnitudes of millimeter and sub-millimeter, and metal line widths in magnitudes of micron and submicron; the connection in an externally tangential manner includes the following cases: ① two rings are externally tangent and a connection metal 8 for connecting two rings is provided at the external tangent point; ② lines at the junction of two rings are in seamless overlapping structure; and ③ lines at the junction of the two rings are in seamless overlapping structure, meanwhile a connection metal 8 for connecting two rings is provided at the overlap; connection in an internally tangential manner includes the following cases: ① two rings are internally tangent and a connection metal 8 for connecting two rings is provided at the internal tangent point; ① lines at the junction of two rings are in seamless overlapping structure, and ② lines at the junction of two rings are in seamless overlapping structure, meanwhile a connection metal 8 for connecting two rings is provided at the overlap. a transparent substrate 4 may be of any transparent material as long as it can serve as the transparent optical window material satisfying the requirements of the applicable occasion, and meanwhile the metal grid 5 can be processed thereon by a certain machining process; according to the machining process, the metal grid 5 can be loaded on the surface of the transparent substrate 4 via an adhesive layer 1; single- or multi-layer antireflection film 3 enhances the light transmission ability of the optical window; a single- or multi-layer protective layer 2 is provided for the purposes of not only preventing the metal portions from being corroded or oxidized due to long-term exposure to the air and causing reduction of shielding capacity, but also preventing the metal grid 5 from being scratched.

In the electromagnetic shielding optical window based on an array of rings and sub-rings having a triangular and orthogonal mixed distribution of the present invention, the basic rings 6 and the sub-rings 7 in the array of the metal grid 5 have diameters in magnitudes of millimeter and sub-millimeter, and metal line widths in magnitudes of micron and submicron, so as to ensure high light transmittance and excellent electromagnetic shielding effect. In addition, the basic rings 6, the sub-rings 7 and the connection metal 8 are made of metals having good conductivity, such as gold, silver, copper, aluminum and other pure metals and metal alloys, and the thickness of the metal is greater than 100 nm.

Figure 2:
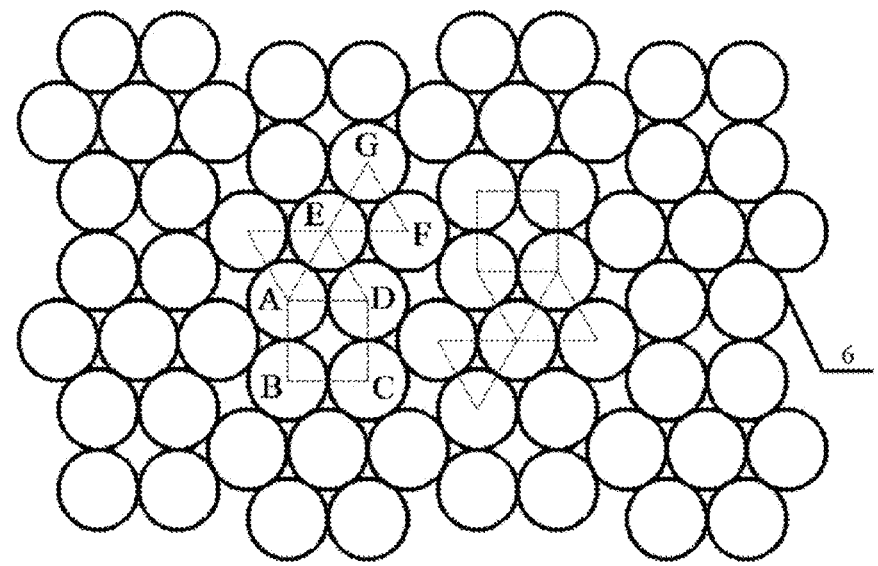
FIG. 2 is a schematic view of a typical structure formed by the basic rings closely-joining arranged according to an equilateral triangular and two-dimensional orthogonal mixed arrangement.

FIG. 2 is a schematic view of a typical structure of the basic rings closely-joining arranged according to an equilateral triangular and two-dimensional orthogonal mixed arrangement. The basic rings respectively have the same diameter and are connected in an externally tangential manner. Adjacent basic rings are arranged according to an equilateral triangular arrangement or in two-dimensional orthogonal arrangement. Adjacent equilateral triangles, adjacent squares, or adjacent equilateral triangle and square share an edge or a vertex therebetween. In FIG. 2, connection lines between the circle centers of adjacent basic rings constitute a square or an equilateral triangle, wherein A, B, C, D, E, F, G are respectively circle centers of any seven adjacent basic rings, quadrangle ABCD is a square, triangles ADE and EFG are both equilateral triangles. Such arrangement guarantees that the basic rings 6 which have the same diameter and are connected in an externally tangential manner are closely-joining arranged according to an equilateral triangular and a two-dimensional orthogonal mixed arrangement to form a two-dimensional metal grid 5 and it is loaded on a surface of an optical window transparent substrate. As a preferred structure, when connection lines between the circle centers of adjacent basic rings 6 constitute an equilateral triangle or a square, any square at least shares an edge or a vertex with an equilateral triangle and any equilateral triangle at least shares an edge or a vertex with a square.

Figure 3:
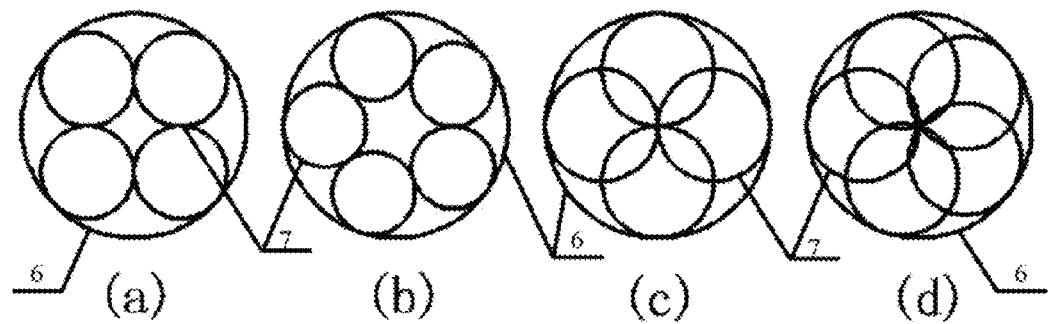
FIG. 3 is a schematic view of preferred structures of a basic unit consisting of basic rings and sub-rings.

In the electromagnetic shielding optical window based on an array of rings and sub-rings having a triangular and orthogonal mixed distribution of the present invention, the sub-rings in each basic unit are in a number of two or more and have the same or different diameters, and the included angle formed by connection lines between the circle centers of adjacent sub-rings and the circle center of the basic ring is at any degree. The sub-rings in different basic units are equal-diameter rings or unequal-diameter rings and are in the same or different numbers; adjacent sub-rings in the basic unit are connected in an externally tangential manner or are intersected with each other. FIG. 3 illustrates a schematic view of a preferred structure of a basic unit consisting of a basic ring and sub-rings. In FIG. 3, the sub-rings in the basic unit have the same diameter, and the included angles formed by the connection lines between the circle centers of adjacent sub-rings and the circle center of the basic ring are equal. FIGS. 3(*a*) and 3(*b*) illustrate that sub-rings 7 having the same diameter in the basic unit are connected in an externally tangential manner, and FIGS. 3(*c*) and 3(*d*) illustrate that sub-rings 7 having the same diameter in the basic unit are connected intersecting each other.

Figure 4:
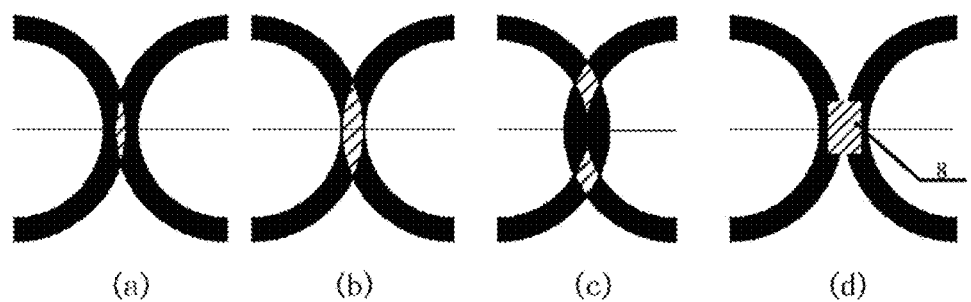
FIG. 4 is a schematic view of the externally tangential manners in which two rings are connected.
Figure 5:
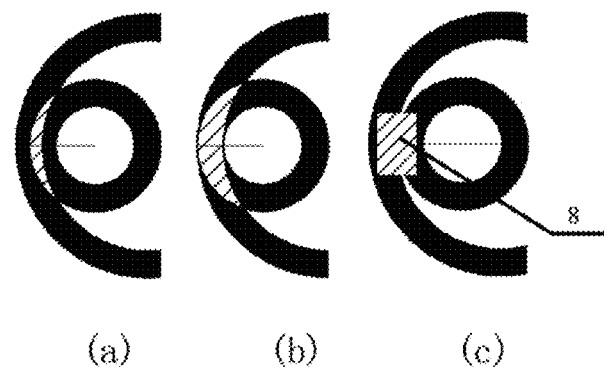
FIG. 5 is a schematic view of the internally tangential manners in which two rings are connected.

FIGS. 4 and 5 respectively show that the two rings are connected in an externally tangential manner or in an internally tangential manner, and by overlapping lines or providing (such as covering) a metal for ensuring reliable electrical connection between the tangent points of the metal rings, it is ensured that the tangential metal rings are closely-joining connected and electrically conductive therebetween. FIGS. 4(a), 4(b) and 4(c) respectively illustrate that the two rings are in seamless overlapping structure when being connected in an externally tangential manner: FIG. 4(a) is a general case of the two rings being seamless overlapped; namely, the circle center distance of two rings is smaller than the circle center distance of the two rings being externally tangent, and larger than the difference between the circle center distance of two rings being externally tangent and a sum of the line widths of the two rings. FIG. 4(b) is special case of two rings being seamless overlapped, wherein the inner and outer contours of the lines of the two rings are mutually externally tangent. FIG. 4(c) is another special case of two rings being seamless overlapped, wherein the circle center distance of two rings is equal to the difference between the circle center distance of two rings being externally tangent and a sum of the line widths of the two rings; namely, the inner contour of the lines of the two rings are externally tangent. In FIG. 4(d), because two rings are externally tangent, it is necessary to provide a metal at the tangent points, so as to ensure reliable electrical connection between the tangent points of the metal rings. FIGS. 5(a) and 5(b) respectively illustrate that two rings are in seamless overlapping structure when being connected in an internally tangential manner: FIG. 5(a) shows a general case of two rings being seamless overlapped when being connected in an internally tangential manner; namely, the circle center distance of two rings is larger than the circle center distance of the rings being internally tangent, and smaller than the sum of the circle center distance of two rings being internally tangent and the line width of the ring having larger diameter. FIG. 5(b) shows a special case of two rings being seamlessly overlapped when being connected in an internally tangential manner, wherein the circle center distance of two rings equals to the sum of the circle center distance of the two rings being internally tangent and the line width of the ring having a lager diameter; namely, the outer contours of the lines of the two rings are internally tangent. FIG. 5(c) shows that the outer contour of the line of the ring having a smaller diameter is internally tangential with the inner contour of the line of the ring having a larger diameter. In this case, it is necessary to provide a metal at the tangent points to ensure reliable electrical connection between the tangent points of the metal rings. In addition, when the two rings are seamlessly overlapped, if the overlapping area between two metal rings is too small to ensure reliable electrical connection between two metal rings, it is also necessary to provide a metal at the tangent points so as to ensure reliable electrical connection between the tangent points of the two metal rings, and further guarantee that the metal rings are connected in an internally or externally tangential manner. FIGS. 4(d) and 5(c) show preferred metal connection manners at the tangent points, and the connection metal 8 covering at the tangent points is rectangular, and the edge length of the rectangle is larger than the line width of the metal rings. When a rectangle is used for covering the tangent points-connection area, one edge of the rectangle should fall entirely within the line of one metal ring, and its opposite edge should fall entirely in the line of another metal ring tangent to it. According to different processing methods and technique levels, other forms of connection metal may be used at the tangent points of the rings, as long as it enables the two tangent metal rings to have reliable electrical connection therebetween.

Figure 6:
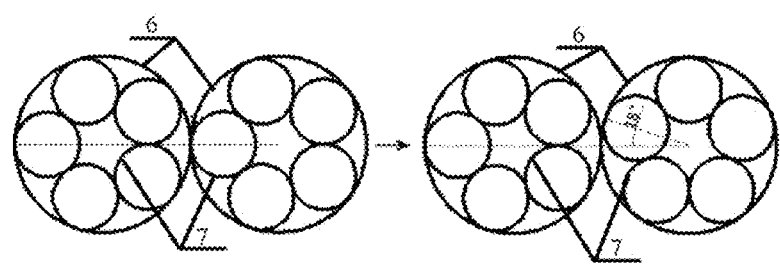
FIG. 6 is a schematic view of a rotation manner of the basic unit of the present invention.

In the present invention, in order to achieve the purpose of homogenizing the stray light caused by high-order diffraction, as a preferred solution, sub-rings 7 in the basic unit have the same diameter, and the included angle formed by the connections lines between the circle centers of adjacent sub-rings 7 and the circle center of the basic ring 6 are equal. On such basis, the sub-rings 7 in different basic units are the same in number and equal in diameter. As a special example of such preferred solution, the relative positions of the sub-rings 7 in different basic units are the same, and a metal grid 5 is formed by duplicating one basic unit and then closely-joining arranging the duplicated basis units according to an equilateral triangular and two-dimensional orthogonal mixed arrangement. In order to achieve good effect of homogenizing stray light caused by the high-order diffraction, as another special example of such preferred solution of the present invention, the sub-rings 7 in the adjacent basic units in the array of the metal grid 5 in the present invention are in different relative positions, and a metal grid 5 is formed by duplicating one basic unit and then closely-joining arranging the duplicated basis units according to an equilateral triangular and two-dimensional orthogonal mixed arrangement, wherein any one of the basic units rotates by a certain angle around the circle center of its basic ring 6 with respect to the adjacent basic unit in a two-dimensional plane. For example, FIG. 6 is a schematic view of the rotation manner of a basic unit with respect to its adjacent basic unit in the present invention, wherein the basic unit of the metal grid 5 employs the structure shown in FIG. 3(b) and the basic unit rotates by an angle of 18° with respect to its adjacent basic unit.

Figure 7:
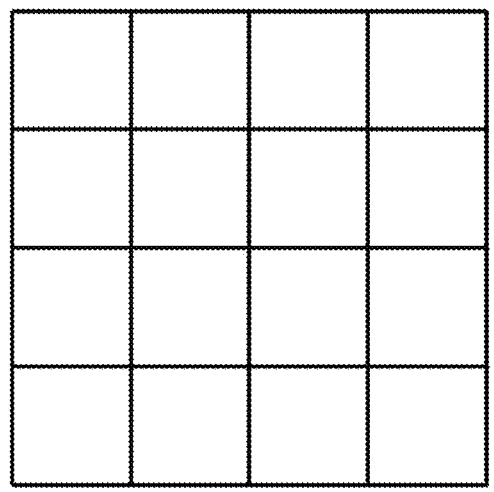
FIG. 7 is a schematic view of the structure of an existing squared grid.
Figure 8:
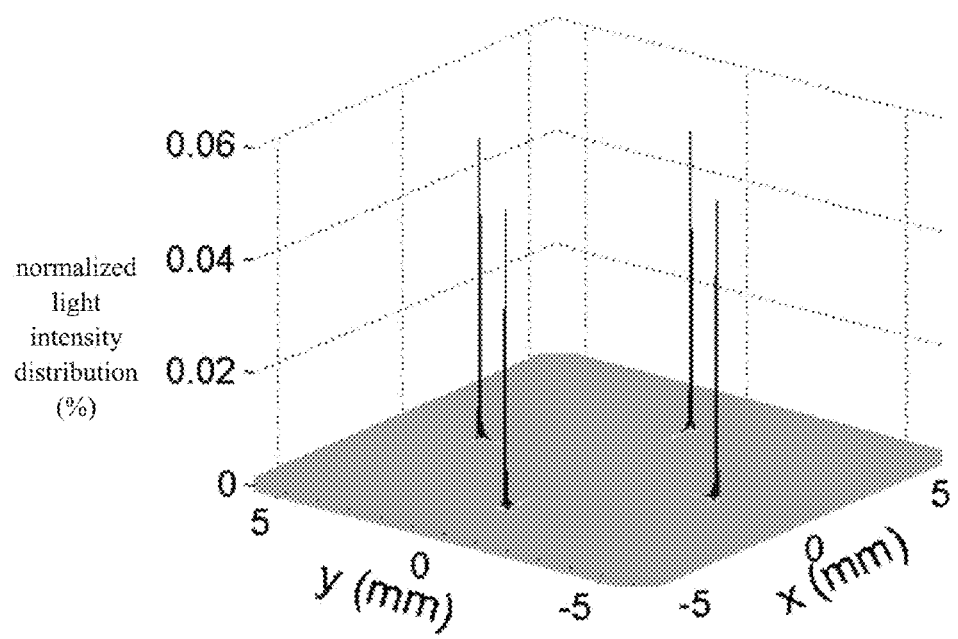
FIG. 8 is a schematic view of the high-order diffraction and relative intensity distribution of an existing squared grid.
Figure 9:
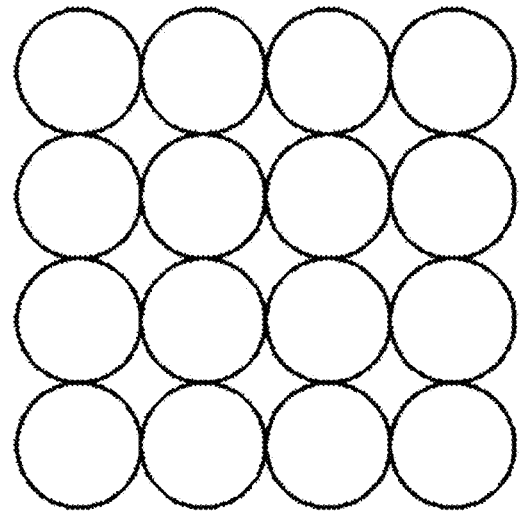
FIG. 9 is a schematic view of the structure of an existing ring grid.
Figure 10:
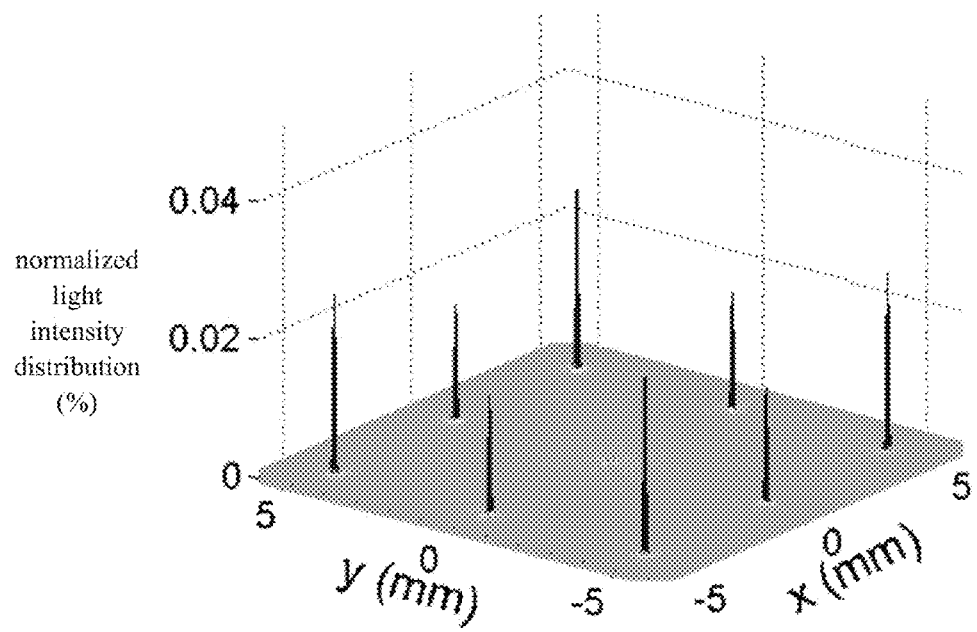
FIG. 10 is a schematic view of the high-order diffraction and its relative intensity distribution of an existing ring grid.
Figure 11:
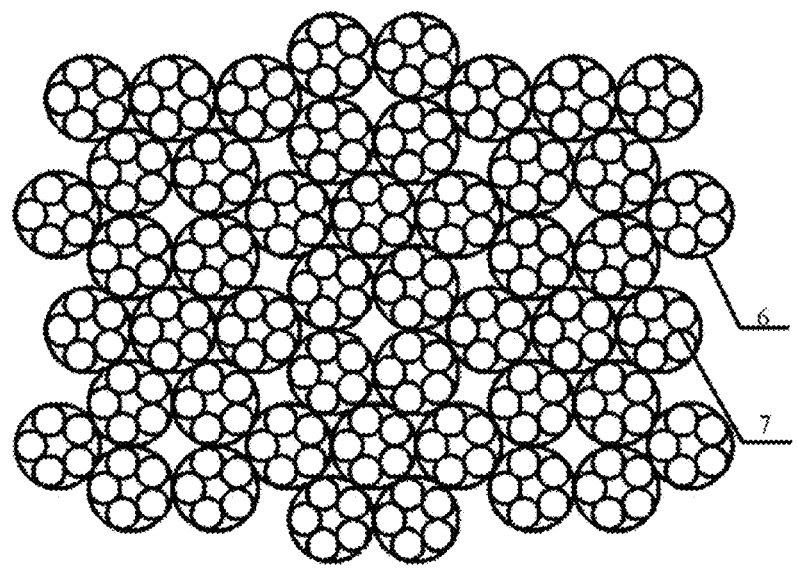
FIG. 11 is a schematic view of the structure of a metal grid in the preferred solution A of the present invention.
Figure 12:
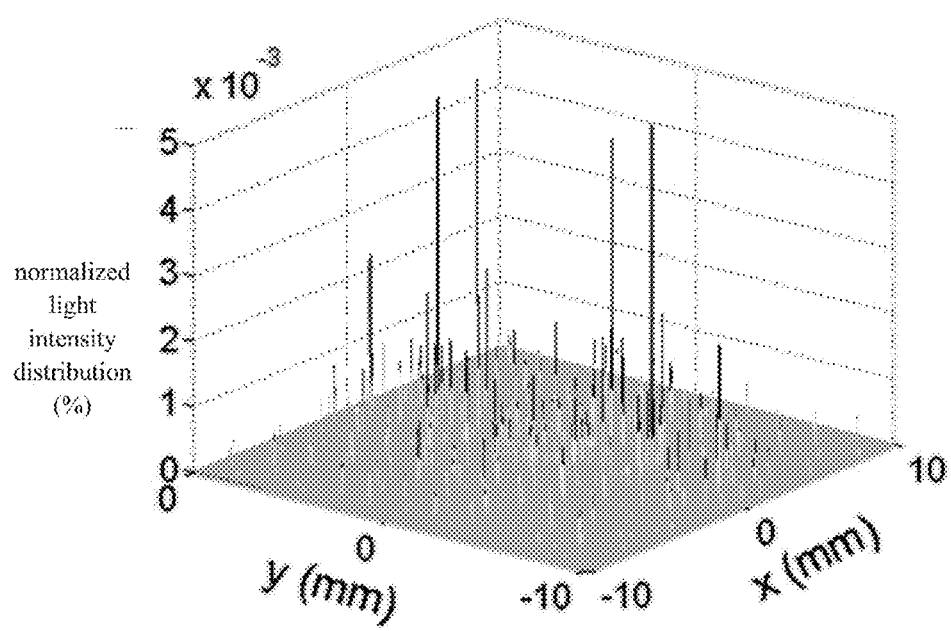
FIG. 12 is a schematic view of the high-order diffraction and relative intensity distribution of the metal grid in the preferred solution A of the present invention.
Figure 13:
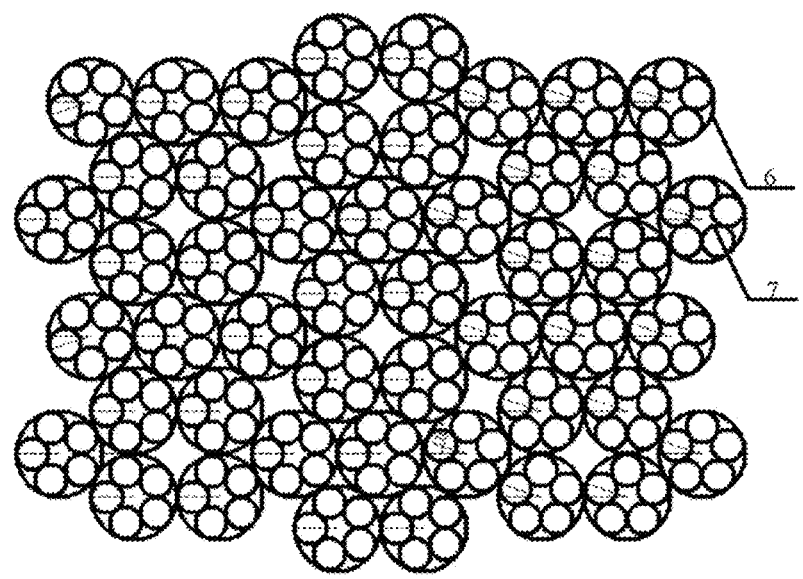
FIG. 13 is a schematic view of a metal grid in the preferred solution B of the present invention.
Figure 14:
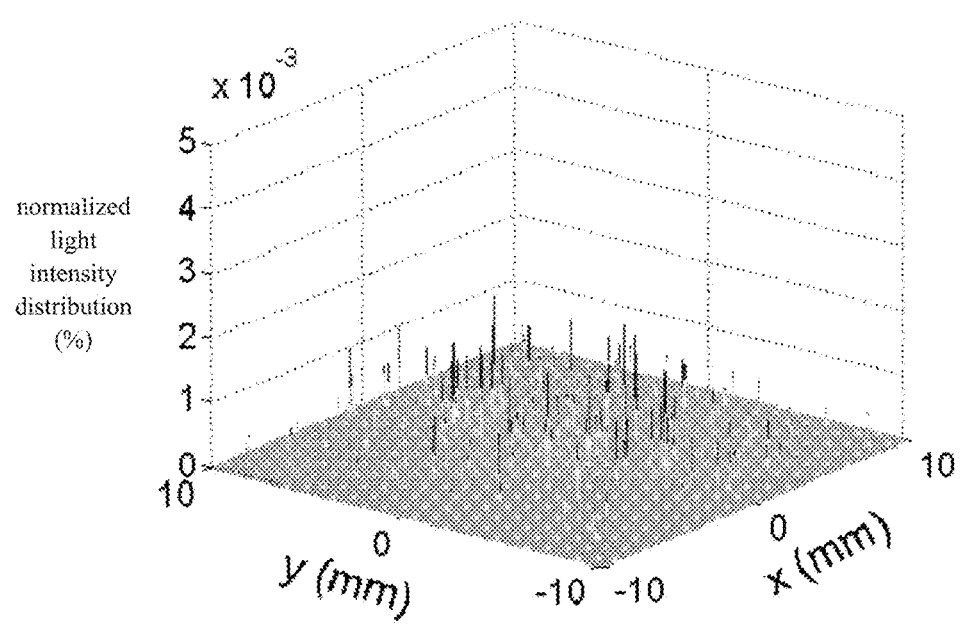
FIG. 14 is a schematic view of the high-order diffraction and relative intensity distribution of the metal grid in the preferred solution B of the present invention.

FIG. 7 and FIG. 8 are respective schematic views of the existing squared grid structure and the distribution of the high-order diffraction thereof and its relative intensity in U.S. Pat. No. 4,871,220. FIG. 9 and FIG. 10 are respective schematic views of the existing ring grid structure and the distribution of the high-order diffraction thereof and its relative intensity in the Patent No. 200610010066.4. FIG. 11 and FIG. 12 are respective schematic views of the structure of the metal grid 5 and the distribution of the high-order diffraction thereof and its relative intensity in the preferred solution A of the present invention. The preferred solution A employs the typical structure formed by the basic rings closely-joining arranged according to an equilateral triangular and two-dimensional orthogonal mixed arrangement as shown in FIG. 2. Five sub-rings are added in the basic ring to form a structure of the basic unit as shown in FIG. 3(b), and the individual basic units do not relatively rotate therebetween. FIG. 13 and FIG. 14 are respect schematic views of the structure of the metal grid 5 and the distribution of the high-order diffraction thereof and its relative intensity in the preferred solution B of the present invention. Unlike the preferred solution A, in the preferred solution B, the basic unit in a certain region rotates relative to the basic unit in the adjacent region in a rotation manner shown in FIG. 6, and the rotation angle is 18°.

Figure 15:
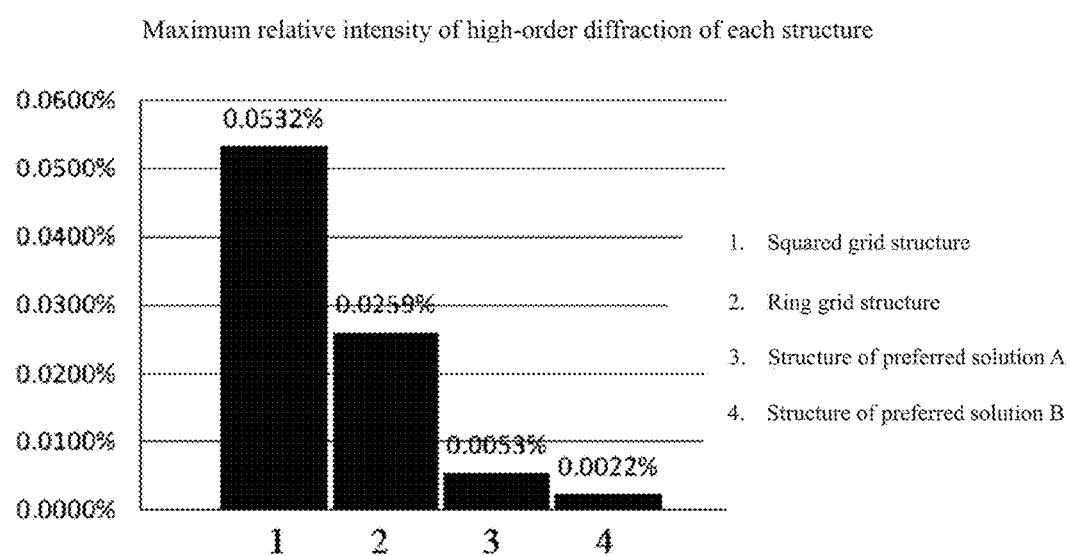
FIG. 15 is a comparison chart of the maximum relative intensity of the high-order diffraction of the above four kinds of grid structures.

In order to illustrate the superiority of the present invention in homogenizing energy distribution of the high-order diffraction, the high-order diffraction energy distribution and the maximum relative intensity of the high-order diffraction of the above four structures are theoretically calculated based on the scalar diffraction theory, in which the light transmittance of each structure is the same (i.e. 95.4%), and the zero-order relative intensity thereof is 91%; that is, the ratios of the useful information for imaging are the same. As compared with the squared ring grid and round ring grid, the metal grid structure of the present invention has obviously reduced maximum relative intensity of the high-order diffraction and noticeably increased number of the high-order diffraction spots in the same detection interval, thereby avoiding the problem of high-order diffraction energy concentrated on a few diffraction orders and allowing the high-order diffraction energy distribution to be more uniform. FIG. 15 shows the specific values of the maximum relative intensity of the high-order diffraction of the above four structures. It can be seen that the maximum relative intensity of the high-order diffraction of the squared metal grid structure is significantly higher than that of other structures. The maximum relative intensity of the high-order diffraction of the metal grid structure corresponding to the solution A of the present invention has been significantly reduced from 0.0259% (the maximum relative intensity of the high-order diffraction of the existing ring grid structure) to 0.0053%, i.e. by 80%, so the homogenizing effect of high-order diffraction is remarkable. As compared with Solution A, the maximum relative intensity of the high-order diffraction of the metal grid structure in the preferred solution B is further reduced from 0.0053% (the maximum relative intensity of the high-order diffraction of the metal grid structure in the preferred solution A) to 0.0022%, i.e. by 58%, further homogenizing the high-order diffraction. Therefore, it proves that optimizing each parameter may achieve significant effect of homogenizing high-order diffraction, which is not only superior to that of the squared metal grid structure in the U.S. Pat. No. 4,871,220, but also superior to that of the existing ring metal grid structure in the Patent No. 200610010066.4.

The composition of the present invention allows meshes to be relative uniform. It achieves excellent light transmittance and shielding properties meanwhile thoroughly homogenizing the high-order diffraction energy distribution. It can improve the defect of the contradiction between light transmittance and shielding efficiency, when used for constructing a double-layer metal grid structure. Meanwhile, since the single-layer structure of the present invention can deeply homogenize the high-order diffraction energy distribution, it can also solve the problem that the existing double-layer metal grid structure cannot further homogenize the high-order diffraction energy distribution due to its limitation of the single-layer grid structure.

In the electromagnetic shielding optical window based on an array of rings and sub-rings having a triangular and orthogonal mixed distribution of the present invention, the metal grid 5 can be manufactured by using the following processing methods: producing a mask by means of electron beam direct writing; plating chrome or titanium on the optical window transparent substrate 4 after cleaning, to form an adhesive layer 1, on which the metallic film is then plated and a photoresist coating is coated for performing photolithography by using the processed mask; and finally performing dry or wet etching, and obtaining the grid pattern after stripping of photoresist. The metal grid pattern based on an array of rings and sub-rings having a triangular and orthogonal mixed distribution may also be produced by omitting the mask production process and directly using a method of laser direct writing. Other microelectronic machining process or binary optical element manufacturing processes, etc. can also be used for producing the metal grid structure of the present invention.

The transparent substrate 4 of the present invention is determined by the practical application occasions, and may be made of ordinary glass, quartz glass, infrared materials, and transparent resin materials and so on. The metallic structure of the basic ring 6 and the sub-rings 7 of the present invention will be processed by proper machining process selected according to the transparent substrate 4, so that they can be applied completely on the transparent substrate 4, and can realize reliable electrical connection or sealing with the window frame, etc., so as to guarantee excellent electromagnetic shielding function. In practical application, the surface of the transparent substrate 4 attached with a grid structure in the present application can be plated with an antireflection film to increase light transmission capability, or a protective layer is plated on the surface of the grid layer to not only prevent the metal structure from being corroded or oxidized due to long-term explosion in the air and causing reduction in shielding capability, but also present the grid layer from being scratched, worn or other damages.

The invention claimed is:

1. An electromagnetic shielding optical window comprising an array of rings and sub-rings having a triangular and orthogonal mixed distribution, wherein:
  a metal grid of the electromagnetic shielding optical window is formed by metal rings of a same diameter as basic rings closely arranged according to an equilateral triangular and two-dimensional orthogonal mixed arrangement and loaded on a surface of an optical window transparent substrate;
  adjacent basic rings are connected in an externally tangential manner, and connection lines between circle centers of adjacent basic rings constitute an equilateral triangle or a square, adjacent equilateral triangles, adjacent squares, or an equilateral triangle and an adjacent square share an edge or a vertex therebetween;
  metal sub-rings are arranged in each of the basic rings and are connected with a corresponding basic ring in an internally tangential manner;
  the basic ring and the sub-rings which are connected to it in an internally tangential manner together constitute a basic unit of a two-dimensional metal grid structure;
  both the basic ring and the sub-rings thereof have diameters in magnitudes of millimeters and sub-millimeters, and metal line widths in magnitudes of microns and submicrons;
  the connection in an externally tangential manner includes:
    two rings are externally tangent and a connection metal for connecting two rings is located at the external tangent points;
    lines at a junction of two rings are in seamless overlapping structure; and
    lines at the junction of the two rings are in seamless overlapping structure, meanwhile a connection metal for connecting two rings is located at an overlap;
  the connection in an internally tangential manner includes:
    two rings are internally tangent and a connection metal for connecting two rings is located at an internal tangent point;
    lines at the junction of two rings are in seamless overlapping structure, and
    lines of two rings at the junction are in seamless overlapping structure, meanwhile a connection metal for connecting two rings is located at the overlap.

2. The electromagnetic shielding optical window according to claim 1, wherein connection lines between circle centers of adjacent basic rings constitute an equilateral triangle or a square, wherein any square at least shares an edge or a vertex with an equilateral triangle and any equilateral triangle at least shares an edge or a vertex with a square.

3. The electromagnetic shielding optical window according to claim 1, wherein, in each basic unit, there are two or more sub-rings and the sub-rings have same or different diameters, and wherein an included angle formed by connection lines between circle centers of adjacent sub-rings and the circle center of the basic ring is at any degree, wherein sub-rings in different basic units are equal-diameter rings or unequal-diameter rings and are a same or different in number.

4. The electromagnetic shielding optical window according to claim 3, wherein, in each basic unit, the diameters of the sub-rings are a same diameter and included angles formed by the connection lines between the circle centers of adjacent sub-rings and the circle center of the basic ring are equal.

5. The electromagnetic shielding optical window according to claim 4, wherein the sub-rings in different basic units comprise a same number and an equal diameter.

6. The electromagnetic shielding optical window according to claim 5, wherein the sub-rings in different basic units are in same relative positions and are closely arranged by one basic unit upon duplication according to an equilateral triangular and two-dimensional orthogonal mixed arrangement.

7. The electromagnetic shielding optical window according to claim 5, wherein the sub-rings in adjacent basic units have different relative positions and are closely arranged by one basis unit upon duplication according to an equilateral triangular and two-dimensional orthogonal mixed arrangement in a two-dimensional metal grid, wherein any basic unit rotates around the circle center of the basic ring by a certain angle in a two-dimensional plane with respect to an adjacent basic unit.

8. The electromagnetic shielding optical window according to claim 1, wherein adjacent sub-rings in the basic unit are connected in an externally tangential manner or intersected with each other.

9. The electromagnetic shielding optical window according to claim 1, wherein the basic rings, the sub-rings, and the connection metal comprise an alloy having good conductivity and a thickness of greater than approximately 100 nanometers (nm).

10. The electromagnetic shielding optical window according to claim 1, wherein an adhesive layer comprises chromium or titanium material.

* * * * *